(12) United States Patent
Monda et al.

(10) Patent No.: US 8,581,616 B2
(45) Date of Patent: Nov. 12, 2013

(54) ELECTRONIC DEVICE

(75) Inventors: Tomoko Monda, Kanagawa (JP); Minoru Mukai, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 315 days.

(21) Appl. No.: 13/041,820

(22) Filed: Mar. 7, 2011

(65) Prior Publication Data

US 2012/0049885 A1  Mar. 1, 2012

(30) Foreign Application Priority Data

Aug. 30, 2010  (JP) .................................. 2010-191766

(51) Int. Cl.
G01R 31/28 (2006.01)

(52) U.S. Cl.
USPC .................................................... 324/763.01

(58) Field of Classification Search
USPC ............. 324/762.01–762.1, 754.01–754.3, 324/750.01–750.3; 257/48; 438/14–18
See application file for complete search history.

(56) References Cited

U.S. PATENT DOCUMENTS 5,786,701 A * 7/1998 Pedder ...................... 324/756.05
6,081,429 A * 6/2000 Barrett ............................ 361/767

FOREIGN PATENT DOCUMENTS

| JP | 5-347473 | 12/1993 |
|---|---|---|
| JP | 10-74800 | 3/1998 |
| JP | 3265197 | 3/2002 |
| JP | 2003-121492 | 4/2003 |
| JP | 2004-111753 | 4/2004 |
| JP | 2009-257863 | 11/2009 |
| JP | 2010-93231 | 4/2010 |

OTHER PUBLICATIONS

Notice of Rejection issued by the Japanese Patent Office on Aug. 21, 2012, for Japanese Patent Application No. 2010-191766, and English-language translation thereof.
Notice of Rejection issued by the Japanese Patent Office on Dec. 11, 2012, for Japanese Patent Application No. 2010-191766, and English-language translation thereof.

* cited by examiner

*Primary Examiner* — Tung X Nguyen
(74) *Attorney, Agent, or Firm* — Finnegan, Henderson, Farabow, Garrett & Dunner, L.L.P.

(57) ABSTRACT

According to one embodiment, an electronic device includes a circuit board, an electronic component, a first pad formed on the circuit board, a second pad formed on the electronic component, a junction which connects the first pad and the second pad, and a detecting unit. The detecting unit detects an electric characteristic of a connection path that includes the junction and at least one of the first pad and the second pad. An insulator is formed in part of a contact area of at least one of the first pad and the second pad that is in contact with the junction.

11 Claims, 11 Drawing Sheets

ELECTRONIC DEVICE

CROSS-REFERENCE TO RELATED APPLICATIONS

This application is based upon and claims the benefit of priority from Japanese Patent Application No. 2010-191766, filed on Aug. 30, 2010; the entire contents of which are incorporated herein by reference.

FIELD

Embodiments described herein relate generally to an electronic device.

BACKGROUND

For an electronic device, in which multiple semiconductor packages with semiconductor chips mounted thereon or multiple electronic components that are chip-type passive components such as resistors and capacitors are implemented, high functionality and multi-functionality has been demanded in recent years. To meet this demand, highly-integrated large-scale semiconductor chips have been developed. Accordingly, the number of electrical junctions such as solder bumps that connect a semiconductor package to a circuit board has been greatly increased. In addition, the size of these electrical junctions tends to be reduced. Thus, problems of ruptured junctions are caused due to repeated temperature changes, bending and impact forces, and vibration that are produced onto the semiconductor package.

To deal with such problems, a technique of avoiding thermal fatigue rupture by use of a resistance detecting unit that is incorporated in the semiconductor package to detect an increase in the resistance that occurs because of thermal fatigue rupture of a detection-dedicated junction has been known.

With the conventional technology, however, rupture of a junction cannot always be accurately detected. The detection-dedicated junctions are arranged in the four corners of the electronic component, and designed to have a shorter life span than that of other junctions. There still remains a possibility that a target junction, for which rupture prediction should be made, is ruptured before rupture of the detection-dedicated junction is detected, because there are variations in the physical properties of materials and forms of junctions. Such rupture of the target junction may also be caused because an unruptured portion remains, for example, near the center of the detection-dedicated junction even after most of the interface between the detection-dedicated junction and an electrode pad is ruptured.

DETAILED DESCRIPTION

In general, according to one embodiment, an electronic device includes a circuit board, an electronic component, a first pad formed on the circuit board, a second pad formed on the electronic component, a junction which connects the first pad and the second pad, and a detecting unit. The detecting unit detects an electric characteristic of a connection path that includes the junction and at least one of the first pad and the second pad. An insulator is formed in part of a contact area of at least one of the first pad and the second pad that is in contact with the junction.

Exemplary embodiments of the electronic device are explained below with reference to the attached drawings.

Figure 1:
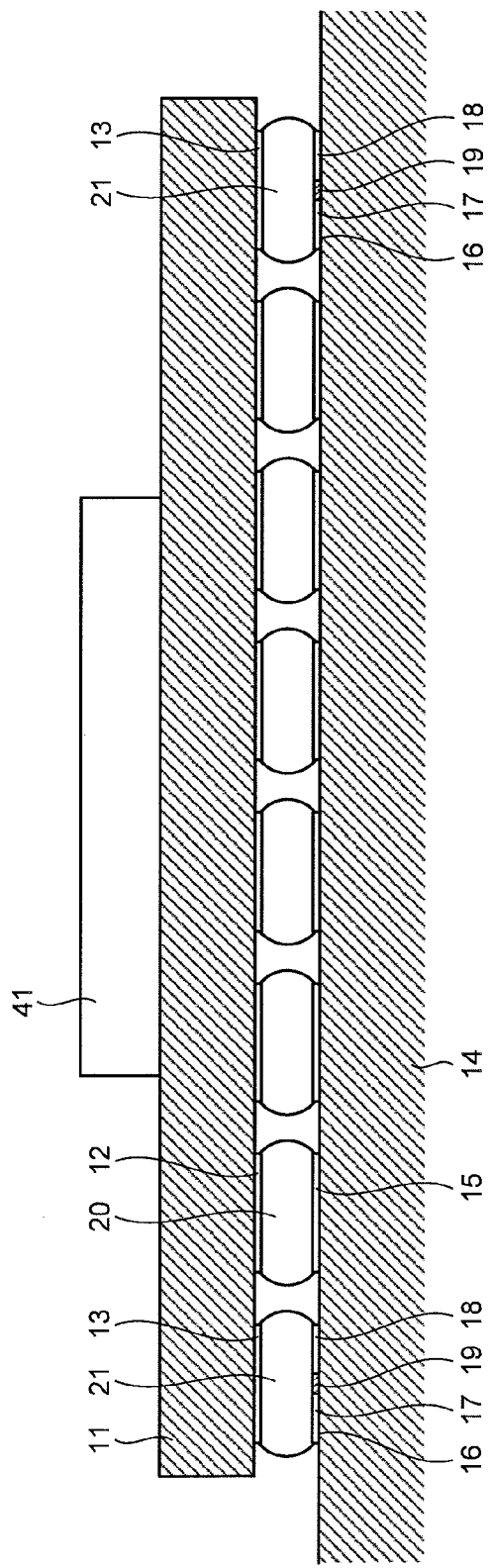
FIG. 1 is a sectional view schematically showing an electronic device according to a first embodiment.
Figure 2:
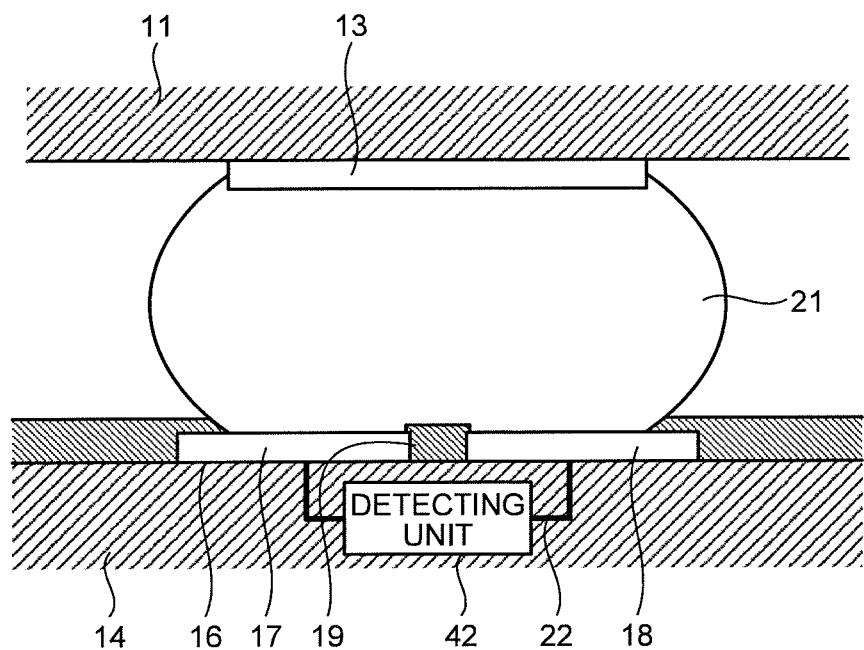
FIG. 2 is a sectional view of a detection bump junction and its surroundings according to the first embodiment.
Figure 3:
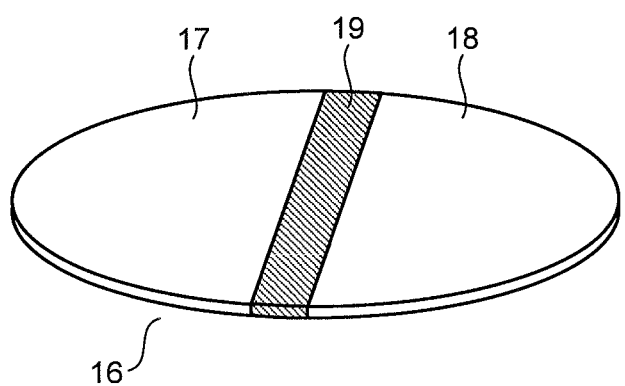
FIG. 3 is a diagram showing the shape of a pad for the detection bump junction according to the first embodiment.

FIG. 1 is a sectional view schematically showing an electronic device according to a first embodiment. FIG. 2 is a sectional view showing a detection bump junction and its surroundings according to the first embodiment. FIG. 3 is a diagram showing the shape of a pad for the detection bump junction formed on the circuit board.

As illustrated in FIG. 1, the electronic device according to the first embodiment includes an electronic component 11, a circuit board 14, bump junctions 20, and detection bump junctions 21. The bump junctions 20 and the detection bump junctions 21 may be solder bumps.

Electronic component pads 12 and 13 are formed on one surface of the electronic component 11. The electronic component may be a BGA semiconductor package. In FIG. 1, an example of the electronic component 11 that is a semiconductor package including a chip 41 is illustrated.

On the other hand, the circuit board 14 may be an FR-4 board, and pads 15 and 16 are formed on one surface thereof. The electronic component 11 and the circuit board 14 are connected to each other by way of the electronic component pads 12 and 13, the bump junctions 20, the detection bump junctions 21, and the pads 15 and 16.

As illustrated in FIG. 2, the electronic component pad 13, the detection bump junction 21, and the pad 16 establish a mechanical connection between the electronic component 11 and the circuit board 14 at each of the four corners of the electronic component 11. As indicated in FIGS. 2 and 3, the pad 16 includes an electrode 17 and an electrode 18 that are formed in the outer portion thereof, and an insulator 19 that insulates the electrode 17 and the electrode 18 from each other. The insulator 19 may be formed of an insulating body coated with a solder resist. The electrode 17, the electrode 18, the insulator 19, and the detection bump junction 21 may be prepared in the following process.

In the process of producing the circuit board 14, a pattern including the electrode 17 and the electrode 18 is formed on the circuit board by etching, and then a solder resist is applied to the circuit board 14 except for the pad portions and the like. Here, the solder resist is applied to the portion between the electrode 17 and the electrode 18 to prepare the insulator 19. The width of the insulator 19 may be 50% of the diameter of the pad 16 or smaller. The electronic component 11 with the bump junctions 20 and the detection bump junctions 21 formed thereon is mounted on the circuit board 14 in such a manner that the detection bump junctions 21 are positioned on the pad 16 and the bump junctions 20 are positioned on the corresponding pads. In the reflow process where the solder is melted by heat, the detection bump junctions 21 are soldered to the circuit board 14, and electrically and physically connected thereto by the electrode 17 and the electrode 18.

Figure 4:
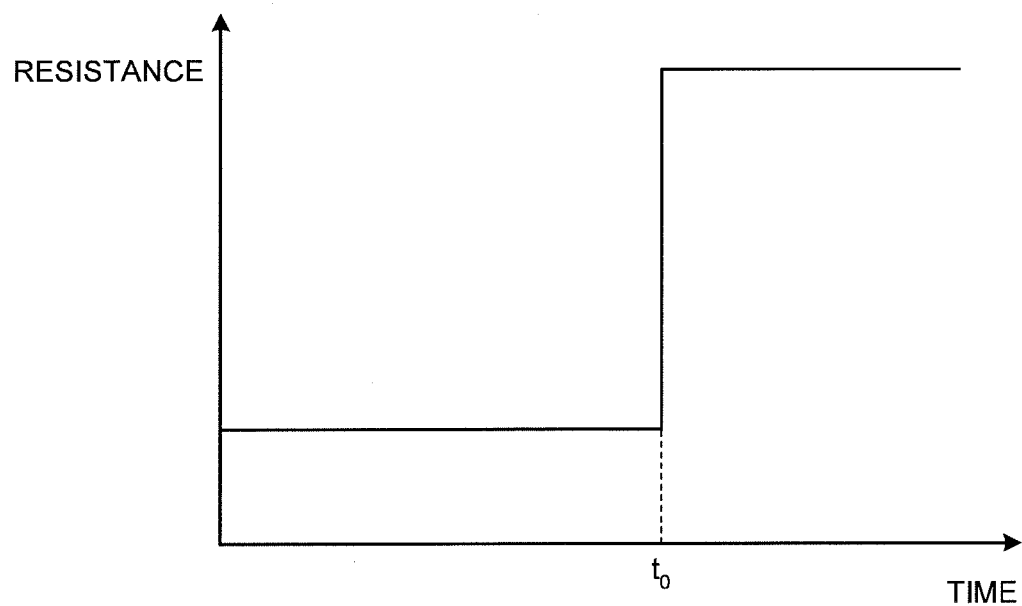
FIG. 4 is a schematic diagram showing an example of time change of the electrical resistance before and after rupture of a connection path.

The electrode 17 and the electrode 18 are spaced apart from each other with the insulator 19 interposed therebetween, and they are each electrically connected to a wire 22 that is formed on the circuit board 14 to measure the electrical characteristic value. A detecting unit 42 is connected to a connection path, which is formed by the wire 22, the electrode 17, the detection bump junction 21, and the electrode 18 to conduct electricity in this order. The detecting unit 42 measures the electrical characteristic value of this connection path, and detects rupture of the detection bump junction 21 based on the measured electrical characteristic value. As the electrical characteristic value, the detecting unit 42 may measure an electrical resistance value. When the measured electrical resistance value exceeds a predetermined level, the detecting unit 42 outputs a signal that indicates rupture of the detection bump junction 21. In FIG. 4, time change of the electrical resistance value before and after the rupture of the connection path is schematically shown, where the ordinate axis represents the electrical resistance value and the abscissa axis represents time. In FIG. 4, it is schematically shown that the connection path is ruptured at time t=t0 and the electrical resistance value is sharply increased.

The electrical characteristic value is not limited to the electrical resistance value. As long as the rupture of the detection bump junction 21 can be detected based on the change of the value, any characteristic value such as a current value and voltage value can be adopted. Furthermore, in FIG. 2, the circuit board 14 is described as to include the detecting unit 42, but the detecting unit 42 may be provided outside the circuit board 14.

Because the wire 22 is formed on the circuit board 14, the present embodiment can be adopted in the electronic component 11 without making any change to the conventional circuit design.

In accordance with the temperature change that is caused by on/off control of the power supply, for example, thermal stress is repeatedly produced onto the detection bump junction 21, which ruptures the detection bump junction 21 and breaks the connection between the electrode 17 or the electrode 18 and the detection bump junction 21. The connection path for measurement of the electrical resistance value is thereby ruptured, and the electrical resistance value measured by the detecting unit 42 increases. As a result, based on the measurement of the electrical resistance value conducted by the detecting unit 42, the rupture of the detection bump junction 21 is detected.

In general, a thermal fatigue crack that is produced in the bump junction by repeated application of thermal stress first appears in its rim in the vicinity of the interface between the electrodes and the junction and develops toward the center. Because the insulator 19 is formed in the central area, the detection bump junction 21 according to the present embodiment is electrically ruptured even if the crack does not reach the center. In other words, the rupture of the detection bump junction 21 and the detection of the rupture are expedited.

In addition, because the curvature of the circuit board 14 characteristically changes at positions immediately under the corners of the electronic component 11, loads applied to the detection bump junctions 21 that are arranged at the four corners close to the positions immediately below the corners of the electronic component 11 are larger than loads applied to the bump junctions 20 on the inner side with respect to the detection bump junctions 21. Thus, the life span of the detection bump junctions 21 is shorter. The positions of the detection bump junctions 21 are not limited to the four corners near the corners of the electronic component 11. It is acceptable that at least in part of the perimeter portion of the electronic component 11 the detection bump junctions 21 are positioned. As a method of designing the detection bump junctions 21 to have a shorter life span than the bump junctions 20, various other methods can be adopted. For example, when the electronic component 11 is a semiconductor package, the detection bump junctions 21 may be arranged near the positions immediately below the corners of the chip (in the example of FIG. 1, near the positions immediately under the corners of the chip 41).

The coefficient of thermal expansion of the insulating body that forms the insulator 19 may be set larger than that of the detection bump junction 21. For example, by adopting a solder resist for the insulator 19 and a solder bump for the detection bump junction 21, the coefficient of thermal expansion of the insulator 19 can be set larger than that of the detection bump junction 21. With such design, the detection bump junction 21 is pushed upward under high temperature due to a difference between the coefficients of thermal expansion of the insulator 19 and the detection bump junction 21.

With this arrangement, the rupture of the detection bump junction 21 is expedited, and after the detection bump junction 21 is ruptured, electrical conductivity between the electrode 17 or the electrode 18 and the detection bump junction 21 is completely cut off so that electrical conductivity can be prevented from being established between the broken sections of the detection bump junction 21 that are brought into contact with each other. In other words, contact that remains after the rupture and tends to interfere suitable rupture detection can be avoided.

With such a design, the detection bump junction 21 has a shorter lifespan than the bump junction 20 so that rupture of the detection bump junction 21 can be detected before the bump junction 20 ruptures. In other words, because the detecting unit 42 detects the rupture of the detection bump junction 21 from the measurement of the electrical resistance value, rupture of the bump junctions 20 can be predicted.

The time of rupture detection can be adjusted by controlling the areas of contact faces of the electrode 17 and the detection bump junction 21 and of the electrode 18 and the detection bump junction 21. The two areas may be equal to or different from each other. When the two areas are different, rupture often occurs in the face with a smaller area. In this case, the rupture is detected when a connection of either one of the electrode 17 to the detection bump junction 21 or the electrode 18 to the detection bump junction 21 is cut off, even if the other connection is not cut off. Thus, rupture detection can be achieved, with the electronic component 11, the detection bump junction 21, and the circuit board 14 being mechanically connected to one another.

Figure 5:
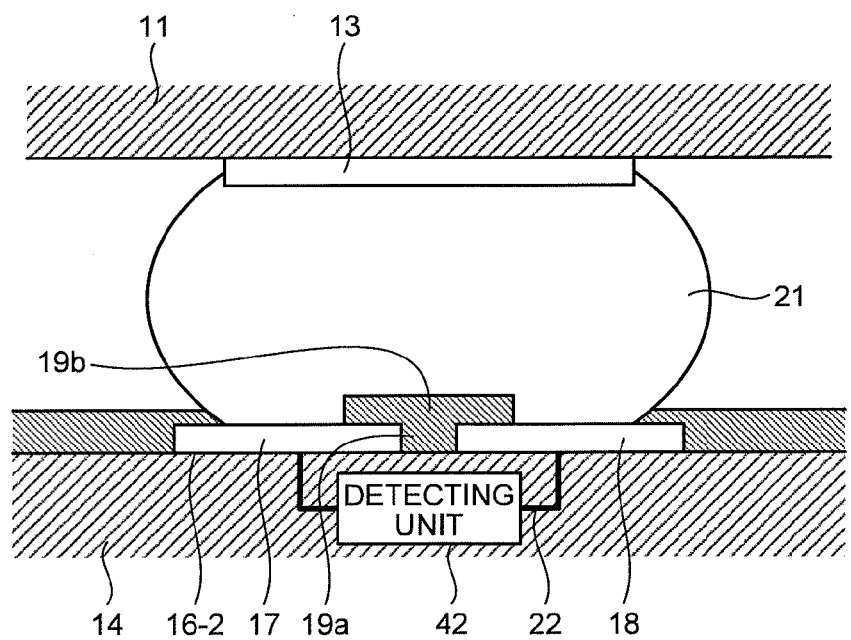
FIG. 5 is a sectional view of a detection bump junction and its surroundings according to a first modification of the first embodiment.
Figure 6:
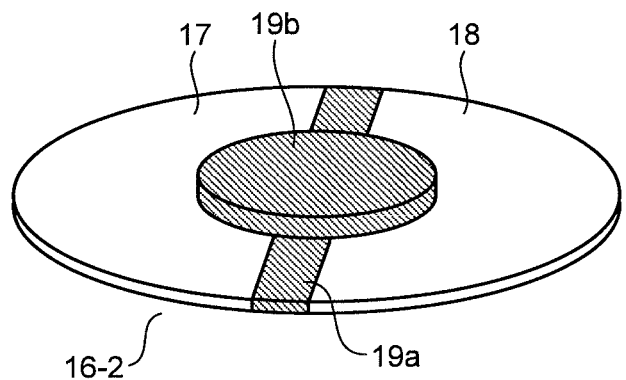
FIG. 6 is a diagram showing the shape of a pad according to the first modification of the first embodiment.

Next, a first modification of the first embodiment is explained. FIG. 5 is a sectional view of a detection bump junction and its surroundings of an electronic device according to the first modification of the first embodiment. FIG. 6 is a diagram showing the shape of a pad 16-2 according to the first modification of the first embodiment. In this modification, portions that are different from the electronic device according to the first embodiment are discussed.

If comparison is made between the electronic device according to this modification and the electronic device according to the first embodiment, the shape of the insulator 19 differs, as illustrated in FIGS. 5 and 6. According to this modification, the insulator 19 includes a linear insulator 19a between the electrode 17 and the electrode 18 and a circular insulator 19b on the electrodes 17 and 18 and the insulator 19a at the center of the insulator 19a.

Because the insulator 19b is formed in this modification, a distance from the outer edge of the detection bump junction 21 to the insulator 19b is reduced in any direction. Thus, rupture detection can be expedited regardless of the orientation of the pad 16-2.

Figure 7:
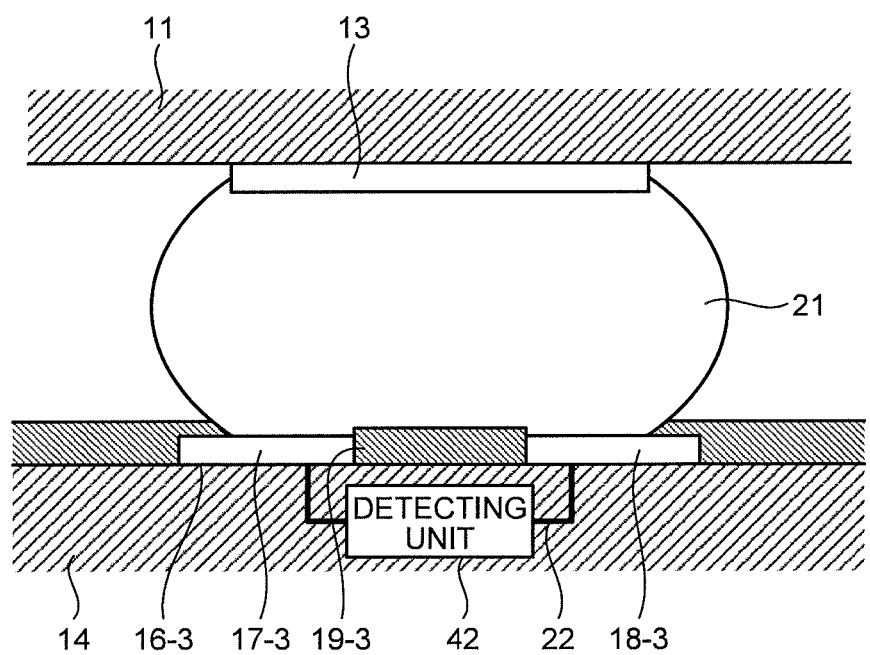
FIG. 7 is a sectional view of a detection bump junction and its surroundings according to a second modification of the first embodiment.
Figure 8:
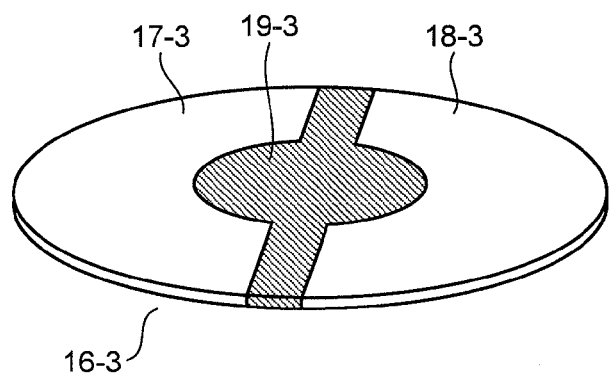
FIG. 8 is a diagram showing the shape of a pad according to the second modification of the first embodiment.

Next, a second modification of the first embodiment is explained. FIG. 7 is a sectional view of a detection bump junction and its surroundings of an electronic device according to the second modification of the first embodiment. FIG. 8 is a diagram showing the shape of a pad 16-3 according to the second modification of the first embodiment. In this modification, portions that are different from the electronic device according to the first embodiment are discussed.

If comparison is made between the electronic device according to this modification and the electronic device according to the first embodiment, the shapes of electrodes 17-3 and 18-3 and an insulator 19-3 mounted on the circuit board 14 differ, as illustrated in FIGS. 7 and 8. According to this modification, the electrode 17-3 and the electrode 18-3 have shapes formed by dividing a ring, which is defined between concentric circles, into two. The electrode 17-3 and the electrode 18-3 may be formed by providing an electrode with a linear notch and a circular notch at the center of the linear notch. According to this modification, the insulator 19-3 is formed between the electrode 17-3 and the electrode 18-3 to have a circular portion and a linear portion extending from the circular portion to the outer edge of the electrode.

According to this modification, similarly to the first modification of the first embodiment, the distance from the outer edge of the detection bump junction 21 to the insulator 19-3 can be reduced in any direction by forming the circular insulator 19-3 at the center of the electrode 17-3 and the electrode 18-3. Thus, rupture detection can be expedited regardless of the orientation of the pad 16-3. Furthermore, because the pad 16-3 has less projections/depressions than the pad in the first modification of the first embodiment, the detection bump junction 21 can be formed more easily.

Figure 9:
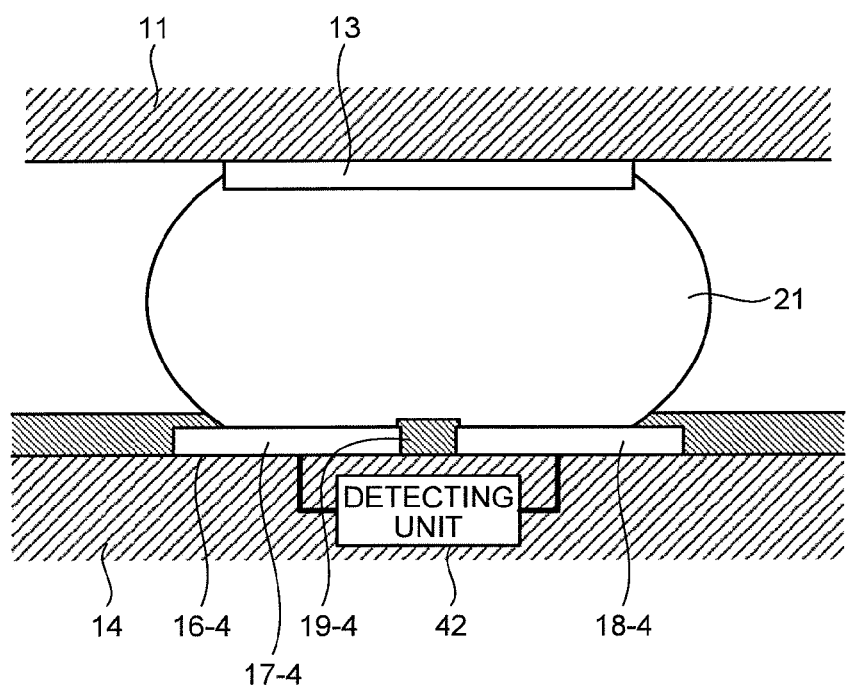
FIG. 9 is a sectional view of a detection bump junction and its surroundings according to a third modification of the first embodiment.
Figure 10:
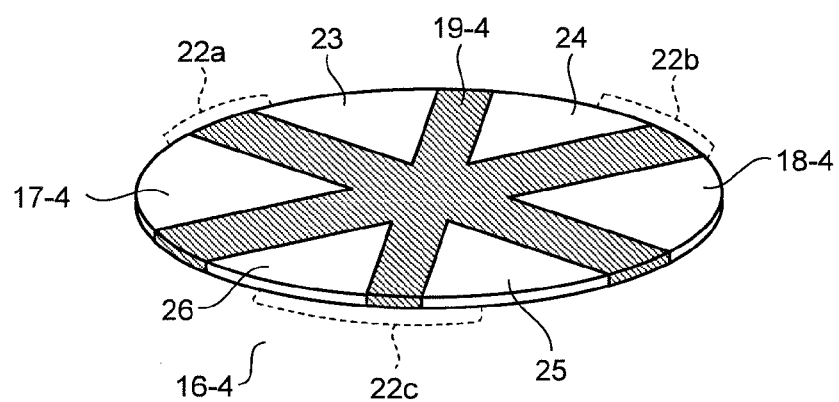
FIG. 10 is a diagram showing the shape of a pad according to the third modification of the first embodiment.

Next, a third modification of the first embodiment is explained. FIG. 9 is a sectional view of a detection bump junction and its surroundings of an electronic device according to the third modification of the first embodiment. FIG. 10 is a diagram for showing the shape of a pad 16-4 according to the third modification of the first embodiment. In this modification, portions that are different from the electronic device according to the first embodiment are explained.

If comparison is made between the electronic device according to this modification and the electronic device according to the first embodiment, the shapes of the electrodes and the insulator that are connected to the detection bump junction 21 and mounted on the circuit board 14 differ. The pad 16-4 according to this modification includes electrodes 17-4, 18-4, 23, 24, 25, and 26 and an insulator 19-4 formed between the electrodes.

According to this modification, six electrodes are prepared and connected to one of wires 22a, 22b, and 22c. Thus, three connection paths can be formed to measure the electrical characteristic values. Thus, rupture detection of the detection bump junction 21 can be conducted in three levels, which improves the accuracy of rupture prediction for the bump junctions 20. It is not necessary to prepare all the wires 22a, 22b, and 22c, but at least one of the wires 22 should be provided. Incidentally, the wires 22 do not always have to connect adjacent electrodes, but may be configured to connect any two of the electrodes.

Figure 11:
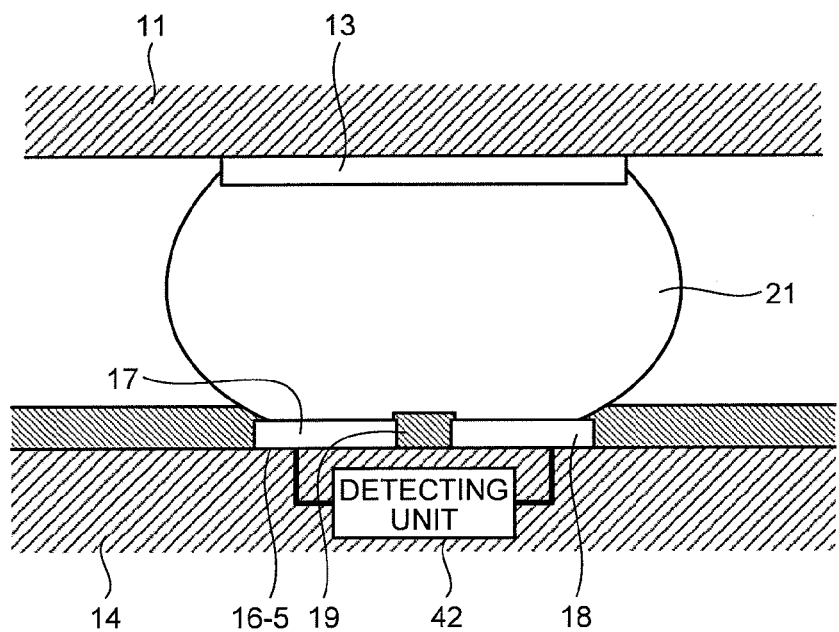
FIG. 11 is a sectional view of a detection bump junction and its surroundings according to a fourth modification of the first embodiment.
Figure 12:
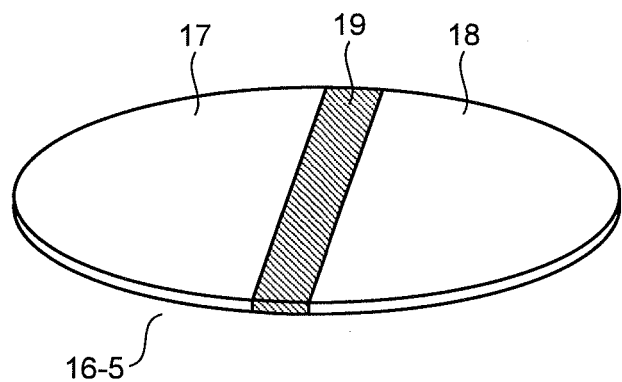
FIG. 12 is a diagram showing the shape of a pad according to the fourth modification of the first embodiment.

Next, a fourth modification of the first embodiment is explained. FIG. 11 is a sectional view of a detection bump junction and its surroundings of an electronic device according to the fourth modification of the first embodiment. FIG. 12 is a diagram showing the shape of a pad 16-5 according to the fourth modification of the first embodiment. In this modification, portions that are different from the electronic device according to the first embodiment are discussed.

If a comparison is made between the electronic device according to this modification and the electronic device according to the first embodiment, design ideas are incorporated regarding the sizes of the electronic component pad 13 and the pad 16-5 mounted on the circuit board 14, as illustrated in FIGS. 11 and 12. According to this modification, the diameter of a portion in which the pad 16-5 on the circuit board 14 is brought into contact with the detection bump junction 21 is smaller than the diameter of a portion in which the electronic component pad 13 is brought into contact with the detection bump junction 21. In other words, the contact area between the pad 16-5 and the detection bump junction 21 is smaller than the contact area between the electronic component pad 13 and the detection bump junction 21.

With such design, stress is more severe in the vicinity of the interface between the pad 16-5 on the circuit board 14 and the detection bump junction 21 than in the vicinity of the interface between the electronic component pad 13 and the detection bump junction 21. As a result, the detection bump junction 21 is ruptured in the vicinity of the interface between the pad 16-5 on the circuit board 14 and the detection bump junction 21.

If the connection between the electronic component pad 13 and the detection bump junction 21 is broken, the electrodes 17 and 18 on the circuit board 14 remain electrically connected to the detection bump junction 21. When this happens, the rupture detection of the detection bump junction 21 cannot be made by the detecting unit 42. According to this modification, however, such situation can be avoided, and therefore the rupture of the bump junction 20 can be accurately predicted.

Figure 13:
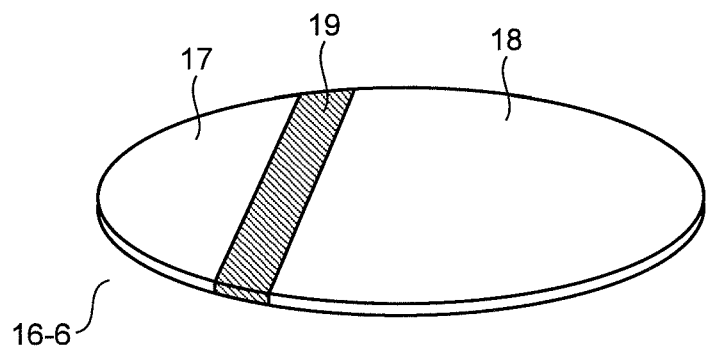
FIG. 13 is a diagram showing the shape of a pad according to a fifth modification of the first embodiment.

In the above examples, the insulator is arranged in a region including the center of the contact area that is in contact with the detection bump junction 21, but the insulator does not always have to be arranged in the region including the center of the contact area. FIG. 13 is a diagram showing the shape of a pad 16-6 according to a fifth modification of the first embodiment.

As indicated in FIG. 13, in the electronic device according to this modification, the insulator 19 that insulates the electrode 17 and the electrode 18 from each other is arranged in a region that does not include the center of the contact area. With such an arrangement, rupture is more likely to occur in the electrode 17 because the area of the electrode 17 is smaller than that of the electrode 18. Thus, even when the electronic component 11, the detection bump junction 21, and the circuit board 14 remain mechanically connected, rupture can be detected.

The forms of the pads in which the insulator is mounted (pads 16, 16-2, 16-3, 16-4, and 16-5) are given merely as examples, and any form can be adopted as long as multiple electrodes (e.g., the electrodes 17 and 18) and an insulator that insulates the electrodes from one another are provided. With any of such forms, electrical rupture occurs before a crack reaches the center of the pad, and the rupture of the detection bump junction 21 can be detected at an earlier stage. In other words, according to the electronic device of the first embodiment, the rupture of the contact portion between the circuit board and the electrical component can be accurately detected well in advance.

In the above examples, the pad that includes the insulator is formed on the circuit board 14. A pad that includes an insulator may be formed on the electronic component 11, or may be formed on both the circuit board 14 and the electronic component 11.

Figure 14:
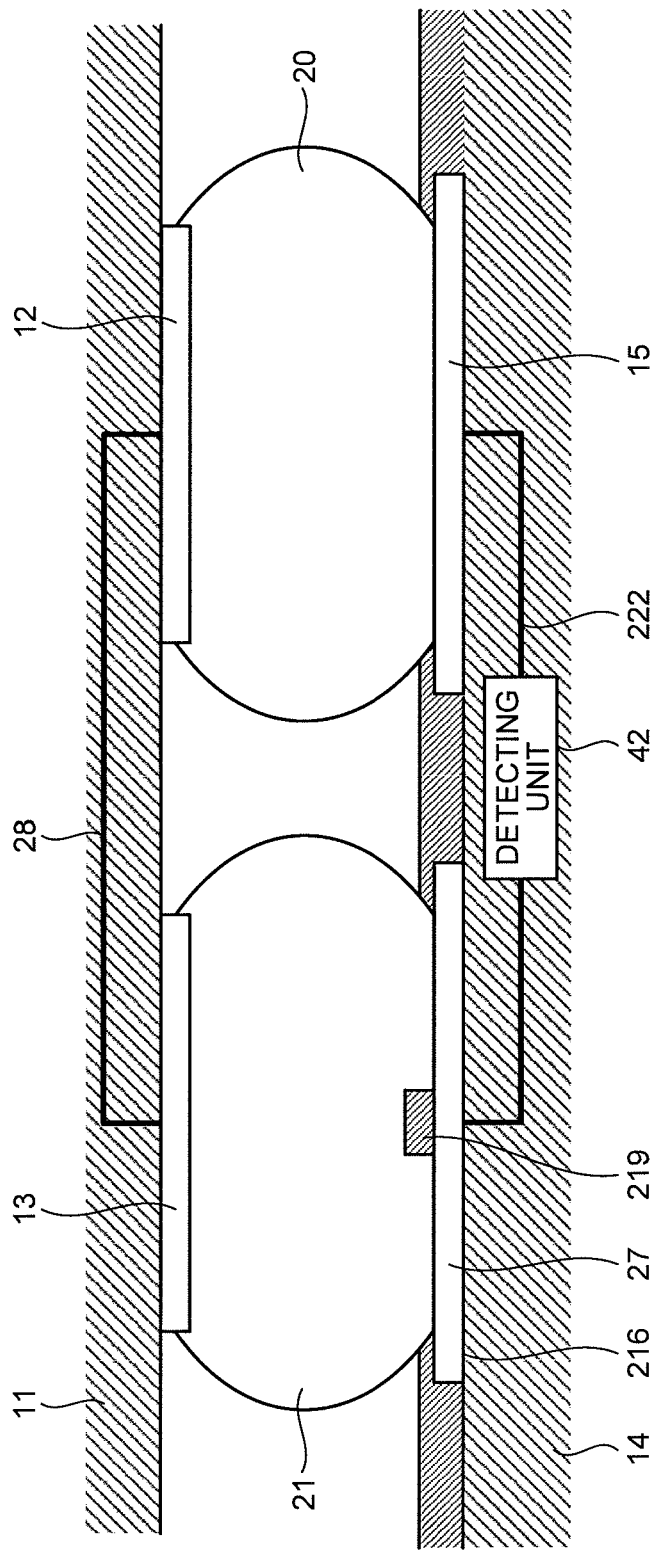
FIG. 14 is a sectional view of a detection bump junction and its surroundings according to a second embodiment.
Figure 15:
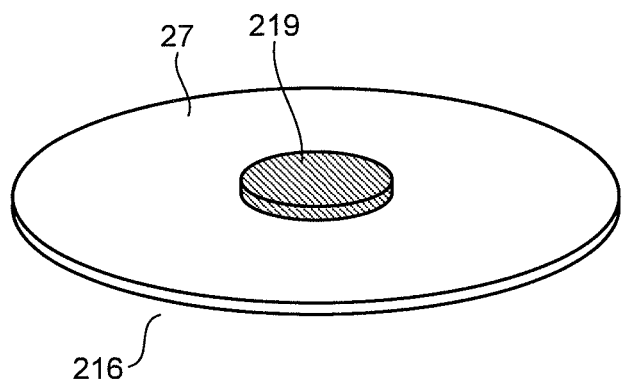
FIG. 15 is a diagram showing the shape of a pad for the detection bump junction according to the second embodiment.

Next, a second embodiment is explained. FIG. 14 is a sectional view of a detection bump junction and its surroundings of an electrical component in an electronic device according to the second embodiment. FIG. 15 is a diagram showing the shape of a pad for the detection bump junction.

The electronic device according to the present embodiment is provided with the same structure as the electronic device according to the first embodiment illustrated in FIG. 1. In the explanation of the second embodiment, portions that are different from the first embodiment are discussed.

If a comparison is made between the electronic device according to the second embodiment and the electronic device according to the first embodiment, the form of a pad 216 that is mounted on the circuit board 14 and connected to the detection bump junction 21 differs, as illustrated in FIGS. 14 and 15. According to the present embodiment, as illustrated in FIGS. 14 and 15, the pad 216 includes a circular electrode 27 and a circular insulator 219 that is formed on the center of the electrode 27 and has a smaller diameter than that of the electrode 27. The insulator 219 does not have to be arranged in the center (in a region including the center) of the electrode 27, but may be formed in any portion that is likely to remain unruptured.

According to the present embodiment, a pad 15 and the electrode 27 are electrically connected to a wire 222 formed in the circuit board 14, and the electronic component pads 12 and 13 are electrically connected to a wire 28 formed in the electronic component 11. According to the present embodiment, the detecting unit 42 is connected to a connection path formed by the pad 15, the bump junction 20, the electronic component pad 12, the wire 28, the electronic component pad 13, the detection bump junction 21, the electrode 27, and the wire 222 that are connected in this order.

According to the present embodiment, if wires are formed in both of the circuit board 14 and the electronic component 11 to measure the electrical characteristic value, the electrode 27 does not have to include multiple electrode units. Then, a conventional component can be adopted without changing its form and readily mounted. In addition, even if the detection bump junction 21 is ruptured in the vicinity of the electronic component pad 13, the detecting unit 42 can detect the rupture, and thus the accuracy is further improved.

Figure 16:
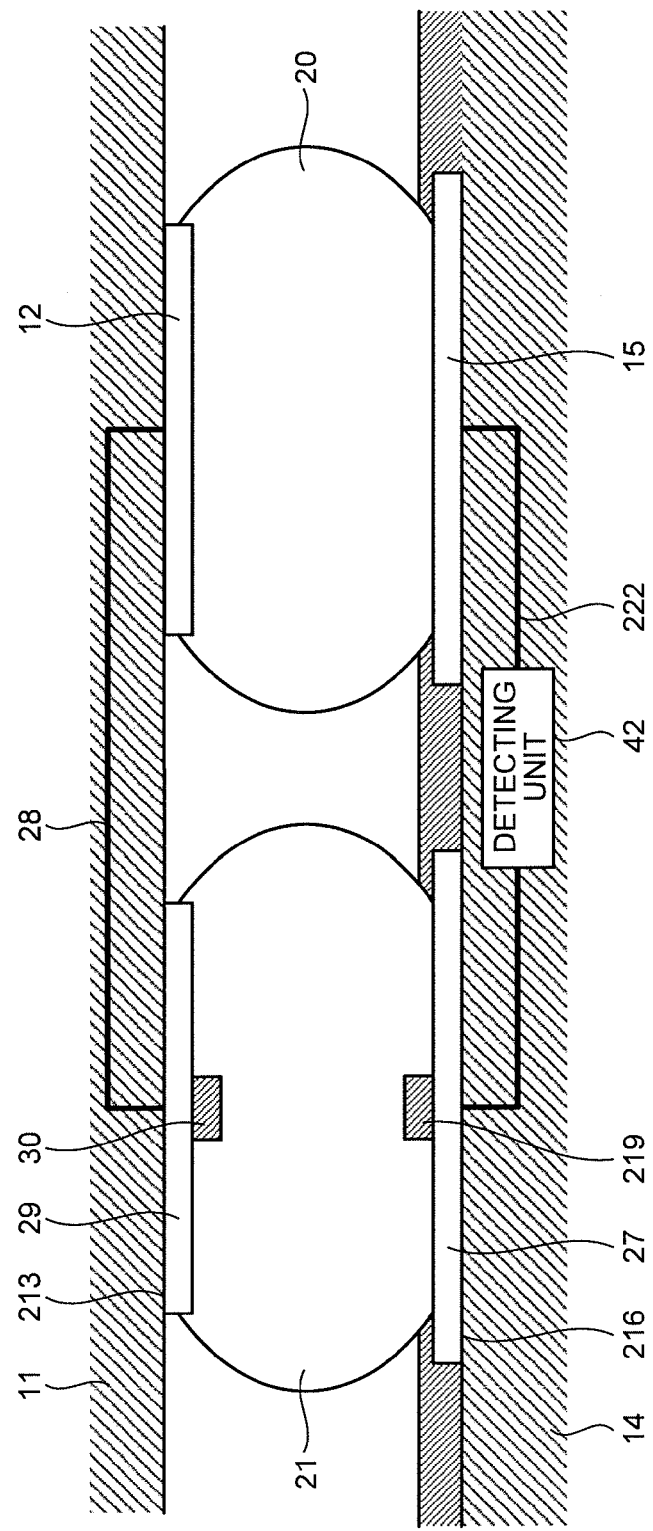
FIG. 16 is a sectional view of a detection bump junction and its surroundings according to a first modification of the second embodiment.
Figure 17:
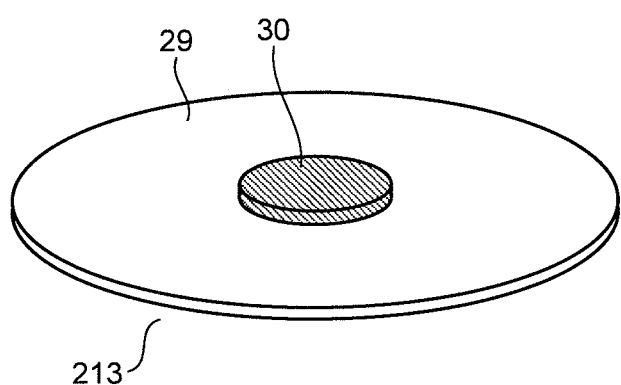
FIG. 17 is a diagram showing the shape of a pad on the electronic component side according to the first modification of the second embodiment.

Next, a first modification of the second embodiment is explained. FIG. 16 is a sectional view of a detection bump junction and its surroundings of an electronic device according to the first modification of the second embodiment. FIG. 17 is a diagram showing the shape of an electronic component pad according to the first modification of the second embodiment. In this modification, portions that are different from the electronic device according to the second embodiment are discussed.

If this modification is compared with the electronic device according to the second embodiment, an electronic component pad 213 of the detection bump junction 21 includes an electrode 29 and a circular insulator 30 that is formed on the center of the electrode 29 and has a smaller diameter than that of the electrode 29, as indicated in FIGS. 16 and 17.

According to this modification, insulators are formed on both the circuit board 14 and the electronic component 11. Thus, the detection bump junction 21 can quickly detect the rupture and predict the rupture of the bump junction 20 when a crack is produced in the vicinity of the electronic component pad 213 or of the pad 216 on the circuit board 14.

As explained above, according to the first and second embodiments, rupture of the junction between the circuit board and an electronic component can be accurately predicted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirits of the inventions.

What is claimed is:

1. An electronic device comprising:
   a circuit board;
   an electronic component;
   a first pad formed on the circuit board;
   a second pad formed on the electronic component;
   a junction which connects the first pad and the second pad; and
   a detecting unit that detects an electric characteristic of a connection path that includes the junction and at least one of the first pad and the second pad,
   wherein an insulator is formed in part of a contact area of at least one of the first pad and the second pad that is in contact with the junction.

2. The electronic device according to claim 1, wherein
   at least one of the first pad and the second pad includes the insulator, which is formed in part of the contact area, and a plurality of electrodes that are insulated from one another by the insulator, and
   the detecting unit detects rupture of the junction, based on the electric characteristic of the connection path that includes at least two of the electrodes.

3. The electronic device according to claim 1, wherein at least one of the first pad and the second pad includes an electrode, and the insulator is formed in part of a contact area of the electrode that is in contact with the junction.

4. The electronic device according to claim 1, wherein the detecting unit detects rupture of the junction based on the electric characteristic.

5. The electronic device according to claim 1, wherein in at least one of the first pad and the second pad, the insulator is formed in a region including center of the contact area.

6. The electronic device according to claim 1, wherein a thermal expansion coefficient of the insulator is different from a thermal expansion coefficient of the junction.

7. The electronic device according to claim 1, wherein a contact area between the first pad and the junction is smaller than a contact area between the second pad and the junction.

8. The electronic device according to claim 1, wherein the junction is a solder bump.

9. The electronic device according to claim 1, wherein
a plurality of the first pads are formed on the circuit board, and
at least part of the first pads that are arranged at opposed positions on a perimeter portion of the electronic component includes the insulator in part of the contact area.

10. The electronic device according to claim 1, wherein
a plurality of the second pads are formed on the electronic component, and
at least part of the second pads that are arranged on a perimeter portion of the electronic component includes the insulator in part of the contact area.

11. The electronic device according to claim 1, wherein the insulator is coated with a solder resist.

\* \* \* \* \*